(12) United States Patent
Cambonie

(10) Patent No.: US 6,960,936 B2
(45) Date of Patent: Nov. 1, 2005

(54) CONFIGURABLE ELECTRONIC DEVICE WITH MIXED GRANULARITY

(75) Inventor: Joël Cambonie, La Combe de Lancey (FR)

(73) Assignee: STMicroelectronics SA, Montrouge (FR)

(*) Notice: Subject to any disclaimer, the term of this patent is extended or adjusted under 35 U.S.C. 154(b) by 45 days.

(21) Appl. No.: 10/770,836

(22) Filed: Feb. 3, 2004

(65) Prior Publication Data

US 2004/0187088 A1 Sep. 23, 2004

(30) Foreign Application Priority Data

Mar. 3, 2003 (FR) .......................................... 03 01197

(51) Int. Cl.$^7$ ................................................. G06F 7/38
(52) U.S. Cl. ............................ 326/39; 326/41; 326/46; 326/40
(58) Field of Search ..................................... 326/38–47

(56) References Cited

U.S. PATENT DOCUMENTS

| 5,357,152 A | 10/1994 | Jennings, III et al. ...... 307/465 |
| 5,970,254 A | 10/1999 | Cooke et al. .......... 395/800.37 |
| 2003/0055852 A1 * | 3/2003 | Wojko ........................ 708/230 |
| 2004/0178818 A1 * | 9/2004 | Crotty et al. ................. 326/40 |

* cited by examiner

Primary Examiner—Anh Q. Tran
(74) Attorney, Agent, or Firm—Lisa K. Jorgenson; Allen, Dyer, Doppelt, Milbrath & Gilchrist, P.A.

(57) ABSTRACT

The configurable electronic device comprises a configurable electronic device includes at least one configurable basic assembly. The basic assembly includes a programmable circuit having a plurality of programmable elements, and a first configurable interconnection network for mutually connecting the programmable circuits. A plurality of configurable arithmetic cells are mutually connected by a second configurable interconnection network. A third configurable interconnection network links the programmable circuit and the configurable arithmetic cells. A control bus is between the programmable circuit and the configurable arithmetic cells, and also extends within the configurable arithmetic cells.

26 Claims, 4 Drawing Sheets

CONFIGURABLE ELECTRONIC DEVICE WITH MIXED GRANULARITY

FIELD OF THE INVENTION

The present invention relates to configurable electronic devices, and in particular, to a configurable electronic device with mixed granularity that is dedicated to arithmetic computations involving words of common lengths.

BACKGROUND OF THE INVENTION

Configurable electronic circuits are defined as being formed of an elementary cell duplicated a certain number of times, and whose inputs/outputs are interconnected by a network of programmable switches. In this regard mention may be made of semi-custom programmable circuits, known as Field-Programmable Gate Array (FPGA) circuits. In FPGA circuits, the elementary cells are programmable memories or look-up tables carrying out logic operations at the bit level, that is, on a limited number of bits, for example 2 to 4 bits, and yielding a result likewise on several bits, for example 1 or 2 bits. The family of Virtex products marketed by the company Xilinx offers such FPGA circuits also comprising a few dedicated arithmetic functions, as well as memory elements.

By using a conventional synthesis method, associated with mapping and routing algorithms, any function described in an RTL language can be implemented on such an FPGA circuit, as long as the circuit has a sufficient number of resources (both at the functional level and at the interconnections level) for implementing all the operations and all the variables described in the original description in the RTL language.

In configurable circuits such as these, the quantity of resources intended to operate at the bit level is considerably bigger than the quantity of arithmetic resources. Furthermore, one cannot really speak of truly arithmetic resources, since the arithmetic operators share the same routing resources as those dedicated to the bit level. Consequently, the use of such circuits FPGA for carrying out essentially arithmetic functions is not really efficient either from a surface area standpoint or from a power consumption standpoint.

Other types of configurable circuits exist, comprising elementary cells of different types, for example a memory element, an arithmetic and logic unit, or possibly a microcontroller. Such examples of configurable circuits are described in the article by Hui Zhang et al. titled "A 1-V Heterogeneous Reconfigurable DSP IC for Wireless Baseband Digital Signal Processing", Journal of Solid-State Circuits, vol. 35, No. 11, November 2000. However, in these reconfigurable circuits, the communication between the various elements is performed asynchronously by transferring data packets. Consequently, it is not possible to use the same mapping methodology as that used in a semi-custom programmable circuit composed of homogenous or common cells. Also, the absence of any tool or methodology renders the use of reconfigurable circuits such as these particularly tricky and inefficient.

SUMMARY OF THE INVENTION

An object of the present invention is to provide a configurable electronic device with mixed programming granularity, in which it is possible to use a mapping methodology similar to the methodologies used in semi-custom programmable circuits, such as FPGA circuits, yet offering better efficiency in terms of area and power consumption for implementation primarily of arithmetic functions.

This and other objects, advantages and features in accordance with the present invention are provided by a configurable electronic device comprising at least one configurable basic assembly comprising a programmable circuit including programmable elements that are mutually connected by a first configurable interconnection network. This programmable circuit may have a programming granularity of a few bits, for example less than or equal to 4 bits.

The configurable electronic device may further comprise several configurable arithmetic cells that are mutually connected by a second specific configurable interconnection network. Each arithmetic cell may include at least one arithmetic and logic unit, an address generator and a memory. A third specific configurable interconnection network may link the programmable circuit and the arithmetic cells, and a control bus may run between the programmable circuit and the arithmetic cells and also inside the latter.

Moreover, the programmable circuit is able to generate clock and control signals for the arithmetic cells. Stated otherwise, the configurable electronic device according to the invention comprises a part dedicated to arithmetic computations, in this instance the configurable arithmetic cells, possessing its own configurable interconnection network, and a circuit programmable at the bit level. This circuit is connected to the part dedicated to arithmetic computations, by another (configurable) programmable interconnection network.

The programming granularity of the device according to the invention is therefore indeed heterogeneous or mixed in the sense that it is fine at the programmable circuit level, whereas it is coarser at the level of the configurable arithmetic cells that are intended to implement arithmetic operations on words of several bits, for example words of 8, 16, 32 bits or even more. Moreover, by providing separate interconnection networks, the flexibility of the assembly is increased, and the resources can be used more efficiently.

Furthermore, according to the invention, all of the control part may be implemented (or mapped) on the programmable circuit with fine programming granularity, whereas all the multibit data part is mapped on the arithmetic resources part (arithmetic and logic unit, possibly multiplier, etc.). Of course, in certain applications in which data processing is described at the bit level, it is then natural to deploy these functions in the programmable circuit with fine programming granularity.

Also, the fact that the microsequencing of the operations is performed by the programmable circuit with fine programming granularity, in combination with the control bus which will convey the control signals necessary for the sequencing of the arithmetic cells, renders the control of the sequencing much more flexible, independent of the data, and also makes it possible to dispense with asynchronous transfers of data packets or of data streams.

According to one embodiment of the invention, the basic assembly may comprise several arithmetic cells mutually connected to form at least one horizontal row of cells. Likewise, it is possible for the basic assembly to comprise several arithmetic cells mutually connected to form at least one column of cells.

According to one embodiment of the invention, each arithmetic cell comprises a first data bus (a horizontal bus) on which are connected the memory and the arithmetic and logic unit. This bus may be connected to the third specific interconnection network (disposed between the arithmetic cells and the circuit with fine programming granularity), or else to the horizontal bus of another arithmetic cell of the same horizontal row.

Moreover, each arithmetic cell may comprise a second data bus (a vertical bus) on which are connected the memory and the arithmetic and logic unit or units. This bus is intended to be connected to the vertical bus of another arithmetic cell of the same column.

The device according to the invention may also comprise several mutually connected basic assemblies. The programmable circuit with fine programming granularity may be a semi-custom programmable circuit, for example of the FPGA type. The device of the invention may advantageously be embodied in the form of an integrated circuit.

BRIEF DESCRIPTION OF THE DRAWINGS

Other advantages and characteristics of the invention will become apparent on examining the detailed description of non-limiting embodiments, and the appended drawings in which.

DETAILED DESCRIPTION OF THE PREFERRED EMBODIMENTS

Figure 1:
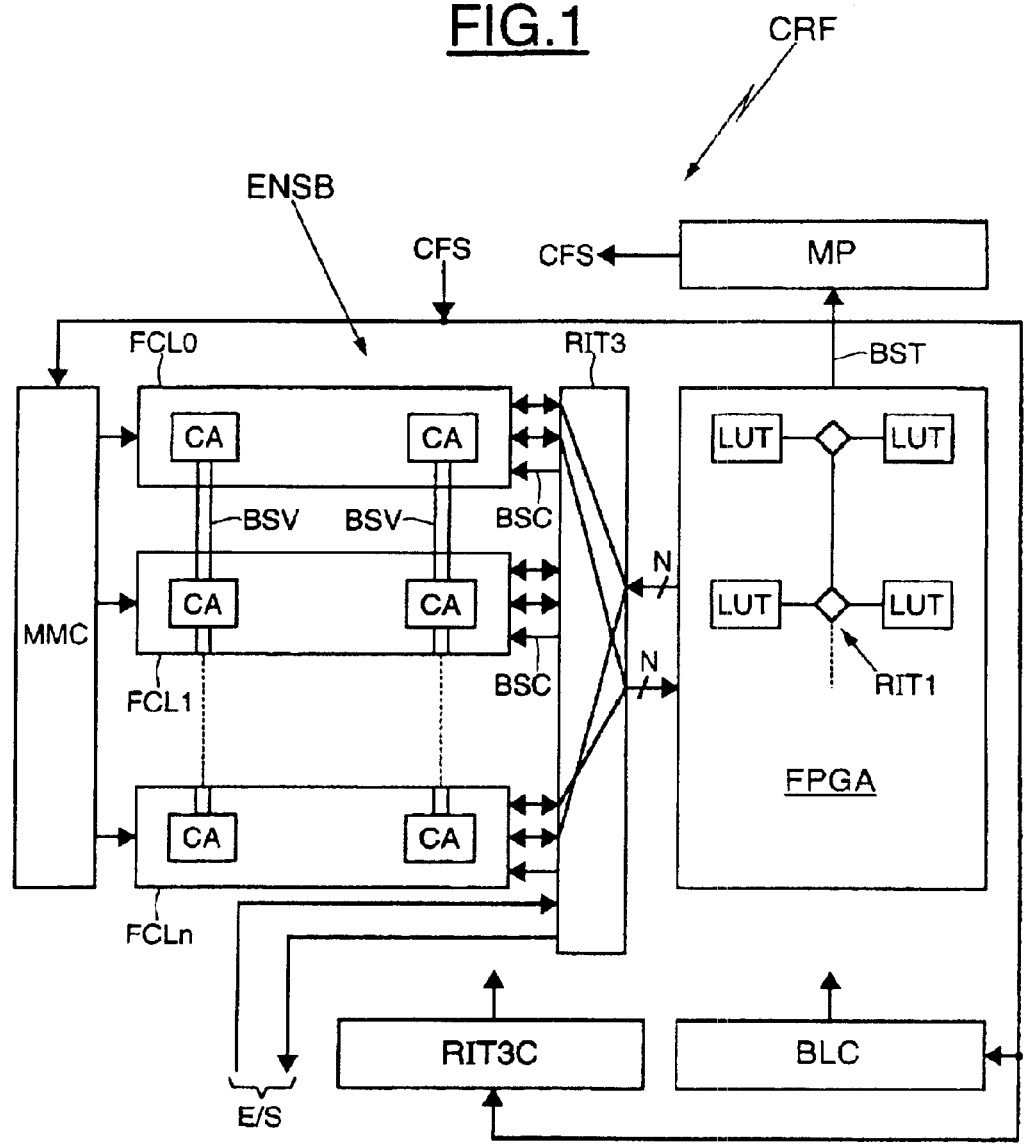
FIG. 1 diagrammatically illustrates a first embodiment of a configurable circuit according to the present invention.

In FIG. 1, the reference CRF designates a configurable circuit according to the invention. This circuit essentially comprises in this embodiment a basic assembly ENSB comprising a programmable circuit FPGA with fine programming granularity, several groups of arithmetic cells FCL0-FCLn, and a programmable or configurable interconnection network RIT3 interconnecting the groups of cells with the circuit FPGA.

Since the programmable circuit FPGA may be a semi-custom programmable FPGA circuit, for example, the reference FPGA has been assigned to this circuit for simplifying reasons. The circuit FPGA can be one of those marketed by the company Xilinx, for example.

Although the structure and the manner of operation of such a programmable circuit FPGA are well known to the person skilled in the art, a few essential elements thereof are briefly recalled here. This circuit is formed of several programmable memories LUT (look-up tables). The memories LUT are, for example, memories of $2^n$ words of m bits with n and m on the order of a few units, for example 2 or 3. Moreover, these memories are interconnected by a first interconnection network RIT1, for example, of the type of that known by the person skilled in the art by the name crossbar.

Figure 2:
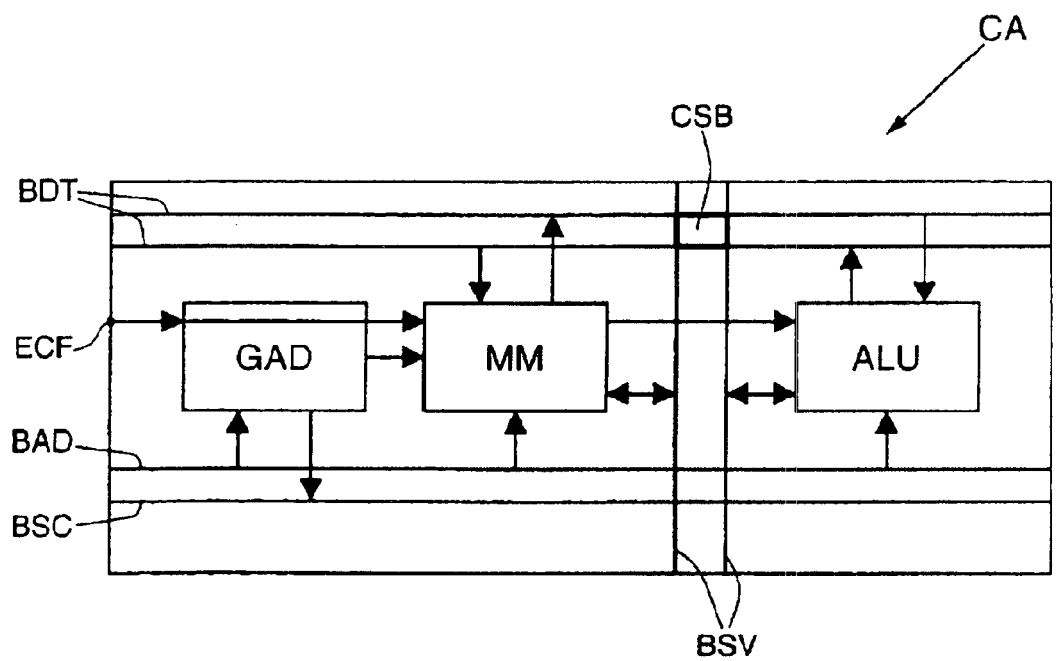
FIG. 2 illustrates in greater detail, but still diagrammatically, an embodiment of a configurable arithmetic cell according to the present invention.

Before continuing the description of FIG. 1, reference is more particularly made to FIG. 2 to describe the internal architecture of an arithmetic cell CA according to the invention. A cell CA comprises computational resources connected to routing resources that authorize the transfer of data between various arithmetic cells and between various resources inside an arithmetic cell.

By way of example, the cell CA comprises at least one arithmetic and logic unit ALU, of conventional structure, comprising for example a multiplier and an adder/subtractor. This unit ALU is connected to memory MM. Moreover, the cell CA may comprise resources more particularly dedicated, such as for example, an address generator GAD, to increase the functionality of the arithmetic cell CA.

These computational resources may be connected to horizontal and vertical resources for routing, which may in this instance be horizontal data buses BDT and vertical buses BSV. These buses may be global or segmented. Moreover, an interconnection means CSB, for example also of the crossbar type, may be disposed at the intersection of these two buses in such a way as to be able to configure the possible steering of the data in any one of the directions.

Apart from these two buses, the cell CA here comprises an address bus BAD to which are connected the address generator, the memory and the arithmetic and logic unit or units. Finally, a control bus BSC conveys the various control signals used for the sequencing of the operations inside the cell CA (clock signals, select signals, write/read signals, reset signals, etc.).

The cell CA also comprises a configuration input ECF intended to receive a configuration word that will make it possible to define, for the various elements of the cell, the specific operations to be carried out (specific instructions in the arithmetic and logic unit, sequences of addresses to be generated, etc), as well as the connections to be carried out.

This configuration is quasi-static in the sense that, in contradiction to conventional processors, the configuration is not modified at each clock cycle, but at a much lower frequency. This configuration is stored in a few static memory cells, for example. Moreover, the arithmetic cell CA can carry out elementary arithmetic operations of the form for example $A*B+C$, where A, B and C are signals coming for example from other arithmetic cells through the global or segmented buses.

Returning now to FIG. 1, it may be seen that each group of cells FCLi comprises several arithmetic cells CA which form a horizontal row. The buses BDT, BSV and BAD of each cell CA are linked to the counterpart buses of the adjacent cells. Moreover, the bus BDT of the cell CA situated at the right end of the group FCLi in FIG. 1, is linked to the circuit FPGA by way of the specific configurable interconnection network RIT3.

The cells CA of various groups of cells may also be linked to form columns, by way of the vertical buses BSV. Finally, all the configuration inputs ECF of the cells CA situated at the left end of the groups in FIG. 1, are linked to a configuration memory MMC intended to store all the cell configuration words. In the example described, the circuit FPGA has N input pins and N output pins. These pins are connected to the buses BDT of the cells CA as well as to the control buses BSC, through the interconnection network RIT3.

This interconnection network may be of any type, for example of the full crossbar type or else of the hierarchical trellis type. The interconnection network RIT3 is programmable by a configuration controller RIT3C in such a way as to carry out the desired interconnection for a given application. The inputs/outputs E/S of the configurable circuit CRF are also connected to the interconnection network RIT3. Likewise, a controller BLC makes it possible to obtain the programming of the memories LUT as well as the configuration desired for the interconnection network RIT1 of the circuit FPGA.

The circuit according to the invention may also comprise a high-level control device, for example a microcontroller, MP that will carry out the interaction between the data and the configurations. Stated otherwise, this microcontroller MP will for example deliver a new configuration loading signal CFS in response to status modifications computed by predetermined status bits BST whose value is computed by the circuit FPGA.

The structure of the configurable circuit according to the invention makes it possible to increase the computational capacity at the bit level, while allowing the implementation of intensive arithmetic computation algorithms.

Moreover, in addition to the fact that the programmable circuit may be used in certain applications to perform computations at the bit level, it is, in all cases, also used to implement all of the control part, and thus to generate the control signals necessary for the sequencing of the operations performed not only on the elements LUT of the circuit FPGA, but also on the arithmetic cells CA. Also, these control signals are conveyed via the interconnection network RIT3 on the control bus or buses BSC.

The implementation of the sequencing of the signals, which is defined as a function of the application by the user, comprises for the arithmetic part, the defining of a state machine that will describe the sequencing of each resource inside each arithmetic cell.

Moreover, as far as the programmable circuit is concerned, after having defined the application, for example using the RTL language, use is made of mapping and routing software, for example the Xilinx mapping and routing software if the circuit FPGA is a Xilinx FPGA. This then makes it possible to allocate each control signal to a pin of the circuit FPGA. Finally, the interconnection network RIT3 is configured.

Figure 3:
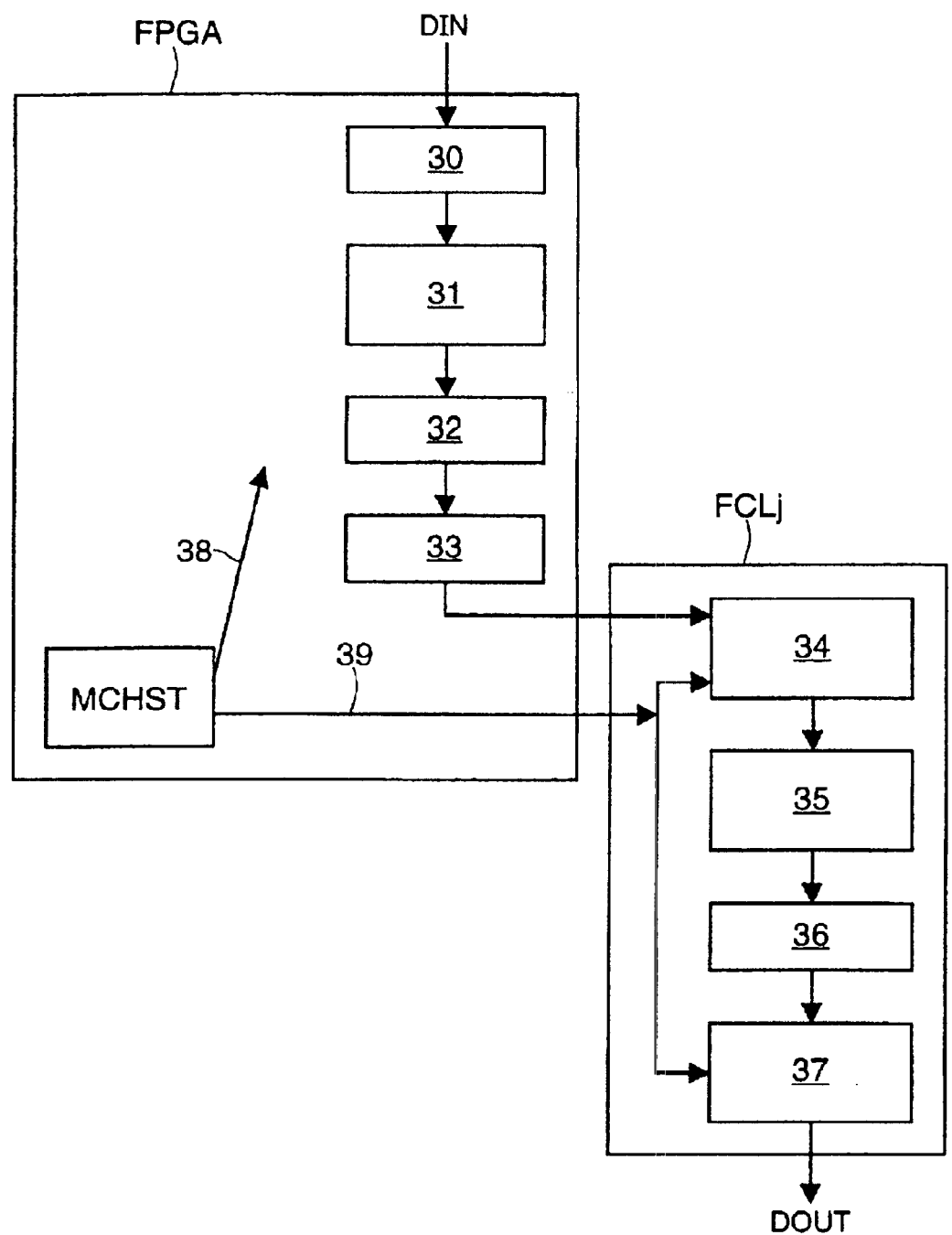
FIG. 3 diagrammatically illustrates an exemplary implementation of a reconfigurable circuit according to the present invention.

Reference is now made more particularly to FIG. 3 to describe an exemplary implementation on a circuit CRF according to the invention, of transmission of a large number of orthogonal carriers (OFDM modulation: Orthogonal Frequency Division Multiplexing) with interleaving at the bit level, convolutional coding with elimination of certain bits, and assigning of bits to a carrier according to quadrature amplitude modulation (QAM modulation), and spreading over the ultimate complex carriers.

A state machine MCHST is determined as indicated above, in such a way as to define the microsequencing 38 of the operations performed at the bit level on the FPGA, as well as the microsequencing 39 of the operations that will be performed at the level of the groups of arithmetic cells FCLj.

In the example cited here, the input data DIN which are for example words of 32 bits constituting the bits to be sent, undergo a scrambling 30 followed by a convolutional coding with elimination of certain bits (puncturing). Next, an interleaving of bits is carried out in the FPGA. The result of this interleaving corresponds after assignment (mapping) to 64 carriers modulated according to a QAM modulation. A slicing is carried out next.

The remainder of the operations, is performed in the groups of arithmetic cells FCLj. This involves in particular an assigning 34 of each bit to a carrier according to a modulation which is predetermined to obtain the carriers which form complex numbers. A spreading 35 is then carried out by using a spreading matrix, thereby making it possible to obtain vectors of complex numbers. These vectors will next be formatted (step 36) then delivered (step 37) at output (data DOUT).

Figure 4:
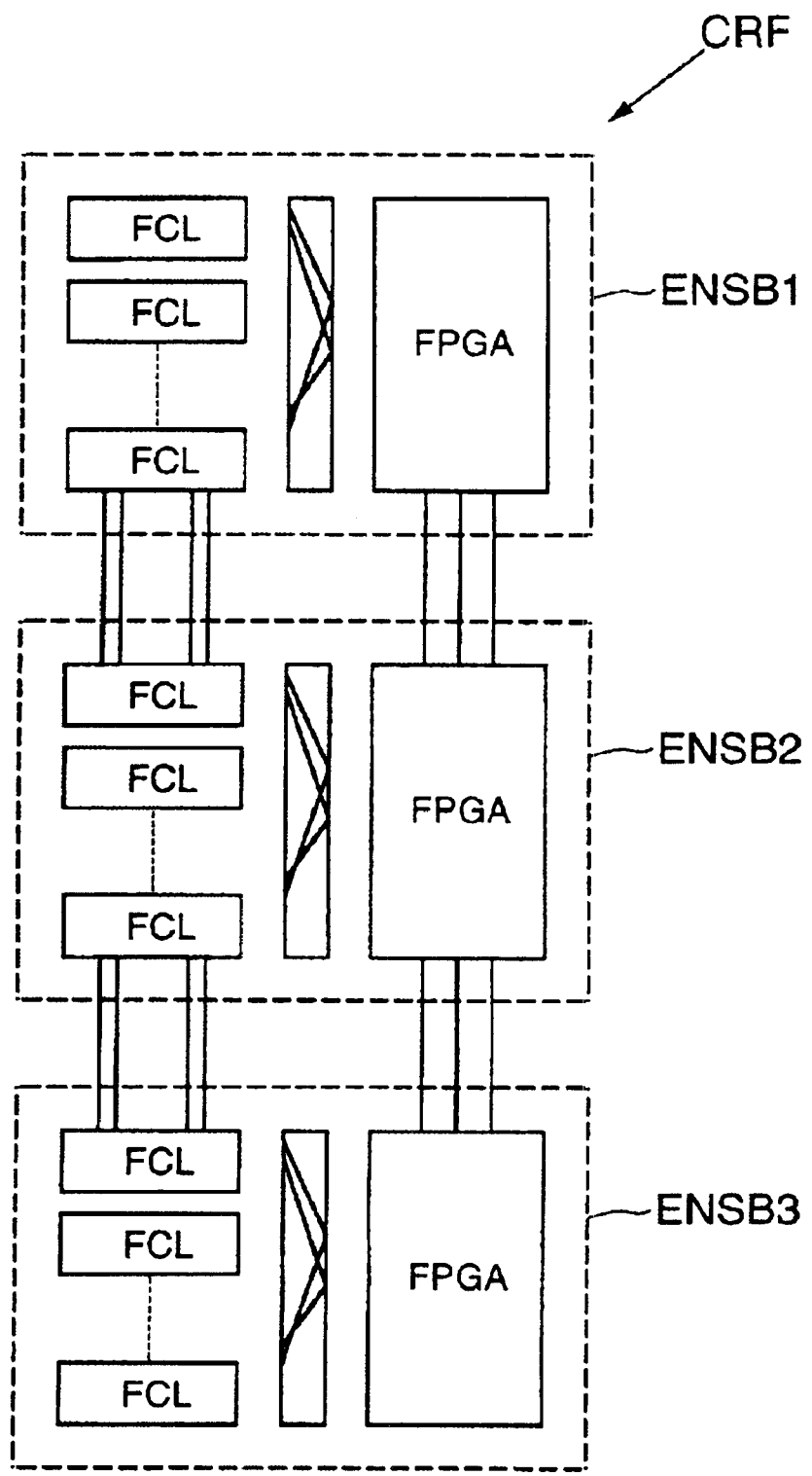
FIG. 4 diagrammatically illustrates another embodiment of a configurable circuit according to the present invention.

It is also possible, as illustrated in FIG. 4, for the circuit CRF according to the invention to comprise several basic assemblies (here, only 3 are represented) ENSB1–ENSB3. In this case, the circuits FPGA of two adjacent basic assemblies are connected, as are the cells of two adjacent rows FCL, by way of the vertical buses BSV.

That which is claimed is:

1. A configurable electronic device comprising:
   at least one configurable basic assembly comprising
      a programmable circuit comprising a plurality of programmable elements and a first configurable interconnection network for mutually connecting said plurality of programmable circuits,
      a second configurable interconnection network,
      a plurality of configurable arithmetic cells mutually connected by said second configurable interconnection network;
      a third configurable interconnection network linking said programmable circuit and said plurality of configurable arithmetic cells, and
      a control bus between said programmable circuit and said plurality of configurable arithmetic cells, and also extending within said plurality of configurable arithmetic cells,
      said programmable circuit generating clock and control signals for said plurality of arithmetic cells.

2. A configurable electronic device according to claim 1, wherein each configurable arithmetic cell comprises at least one arithmetic and logic unit (ALU), an address generator, and a memory connected to said control bus.

3. A configurable electronic device according to claim 1, wherein said programmable circuit has a programming granularity of less than or equal to 4 bits.

4. A configurable electronic device according to claim 1, wherein said plurality of arithmetic cells include at least two arithmetic cells mutually connected to form at least one row of cells.

5. A configurable electronic device according to claim 1, wherein said plurality of arithmetic cells include at least two arithmetic cells mutually connected to form at least one column of cells.

6. A configurable electronic device according claim 2, wherein said second configurable interconnection network for each arithmetic cell comprises:
   a first data bus defining a horizontal bus connecting said memory and said at least one ALU, said first data bus also connecting at least one of said third interconnection network and said first data bus in another arithmetic cell of a same row; and
   a second data bus defining a vertical bus connecting said memory and said at least one ALU, said second data bus also connecting to a vertical bus of another arithmetic cell of a same column.

7. A configurable electronic device according to claim 1, wherein said at least one configurable basic assembly comprises a plurality of mutually connected configurable basic assemblies.

8. A configurable electronic device according to claim 1, wherein said programmable circuit comprising a field programmable gate array.

9. A configurable electronic device according to claim 1, further comprising a substrate with said at least one configurable basic assembly thereon so that the configurable electronic device comprises an integrated circuit.

10. An electronic device comprising:
    a plurality of configurable basic assemblies connected together, each configurable basic assembly comprising
       a programmable circuit comprising a plurality of programmable elements and a first configurable interconnection network for mutually connecting said plurality of programmable circuits, a second configurable interconnection network, a plurality of configurable arithmetic cells mutually connected by said second configurable interconnection network, each configurable arithmetic cell comprising at least one arithmetic and logic unit (ALU), an address generator, and a memory;

a third configurable interconnection network linking said programmable circuit and said plurality of configurable arithmetic cells, and a control bus between said programmable circuit and said plurality of configurable arithmetic cells, and also extending within said plurality of configurable arithmetic cells.

11. An electronic device according to claim 10, wherein each configurable arithmetic cell comprises at least one arithmetic and logic unit (ALU), an address generator, and a memory connected to said control bus.

12. An electronic device according to claim 10, wherein each programmable circuit generates clock and control signals for said plurality of arithmetic cells associated therewith.

13. An electronic device according to claim 10, wherein said programmable circuit has a programming granularity of less than or equal to 4 bits.

14. An electronic device according to claim 10, wherein said plurality of arithmetic cells include at least two arithmetic cells mutually connected to form at least one row of cells.

15. An electronic device according to claim 10, wherein said plurality of arithmetic cells include at least two arithmetic cells mutually connected to form at least one column of cells.

16. An electronic device according claim 11, wherein said second configurable interconnection network for each arithmetic cell comprises:

a first data bus defining a horizontal bus connecting said memory and said at least one ALU, said first data bus also connecting at least one of said third interconnection network and said first data bus in another arithmetic cell of a same row; and a second data bus defining a vertical bus connecting said memory and said at least one ALU, said second data bus also connecting to a vertical bus of another arithmetic cell of a same column.

17. An electronic device according to claim 10, wherein said programmable circuit comprising a field programmable gate array.

18. A method for making a configurable electronic device comprising:

providing at least one configurable basic assembly comprising mutually connecting a plurality of programmable elements using a first configurable interconnection network for defining a programmable circuit, mutually connecting a plurality of configurable arithmetic cells using a second configurable interconnection network;

connecting the programmable circuit and the plurality of configurable arithmetic cells using a third configurable interconnection network, and connecting a control bus between the programmable circuit and the plurality of configurable arithmetic cells, the control bus also extending within the plurality of configurable arithmetic cells.

19. A method according to claim 18, wherein each configurable arithmetic cell comprises at least one arithmetic and logic unit (ALU), an address generator, and a memory connected to the control bus.

20. A method according to claim 18, wherein the programmable circuit generates clock and control signals for the plurality of arithmetic cells.

21. A method according to claim 18, wherein the programmable circuit has a programming granularity of less than or equal to 4 bits.

22. A method according to claim 18, wherein the plurality of arithmetic cells include at least two arithmetic cells mutually connected to form at least one row of cells.

23. A method according to claim 18, wherein the plurality of arithmetic cells include at least two arithmetic cells mutually connected to form at least one column of cells.

24. A method according claim 19, wherein the second configurable interconnection network for each arithmetic cell comprises:

a first data bus defining a horizontal bus connecting the memory and the at least one ALU, the first data bus also connecting at least one of the third interconnection network and the first data bus in another arithmetic cell of a same row; and a second data bus defining a vertical bus connecting the memory and the at least one ALU, the second data bus also connecting to a vertical bus of another arithmetic cell of a same column.

25. A method according to claim 18, wherein the at least one configurable basic assembly comprises a plurality of mutually connected configurable basic assemblies.

26. A method according to claim 18, wherein the programmable circuit comprising a field programmable gate array.

* * * * *